May 13, 1969 W. M. POSINGIES 3,443,573

FLUID APPARATUS

Filed Feb. 21, 1966

INVENTOR.

WALTER M. POSINGIES

BY Ronald T. Reiling

ATTORNEY

United States Patent Office 3,443,573
Patented May 13, 1969

3,443,573

FLUID APPARATUS

Walter M. Posingies, Minneapolis, Minn., assignor to Honeywell Inc., Minneapolis, Minn., a corporation of Delaware Filed Feb. 21, 1966, Ser. No. 528,927
Int. Cl. F15c *1/12;* G06m *1/12*
U.S. Cl. 137—81.5 10 Claims

ABSTRACT OF THE DISCLOSURE

Bistable fluid apparatus having substantially non-variant dynamic switching threshold requirements comprising a proportional fluid amplifier cascaded with a bistable fluid amplifier and feedback circuits connecting the output of the bistable amplifier to the control passages of the proportional amplifier.

This invention is related to pure fluid apparatus and more particularly to bistable pure fluid apparatus.

Recently, a new area of technology utilizing pure fluid apparatus and systems has developed in the control industry. A pure fluid control system is a system wherein the sensing, amplification, compensation and actuation are accomplished by means of pure fluid apparatus. A pure fluid apparatus is a device that has no moving parts other than the fluid medium. When referring to a pure fluid system or apparatus in this specification, it will be understood that the system or apparatus has no moving parts other than the fluid medium.

In a pure fluid system for various control systems (for example, a machine tool control) digital or pulse duration modulation techniques have distinct advantages over analogue systems. Most digital or pulse modulation pure fluid control systems require pure fluid bistable apparatus. However, prior art bistable apparatus introduce severe errors into the control system. The errors are caused by an inherent, random variation in the dynamic switching threshold level of a bistable apparatus. The switching threshold level of a bistable apparatus is defined as the pressure differential required across the fluid stream emanating from the supply passage to switch the bistable apparatus. The variation in the switching threshold level in prior art bistable apparatus often exceeds 30 percent. The applicant's invention substantially eliminates this error by controlling a prior art bistable pure fluid apparatus by means of proportional pure fluid amplifier means and feedback circuit means.

Figure 1:
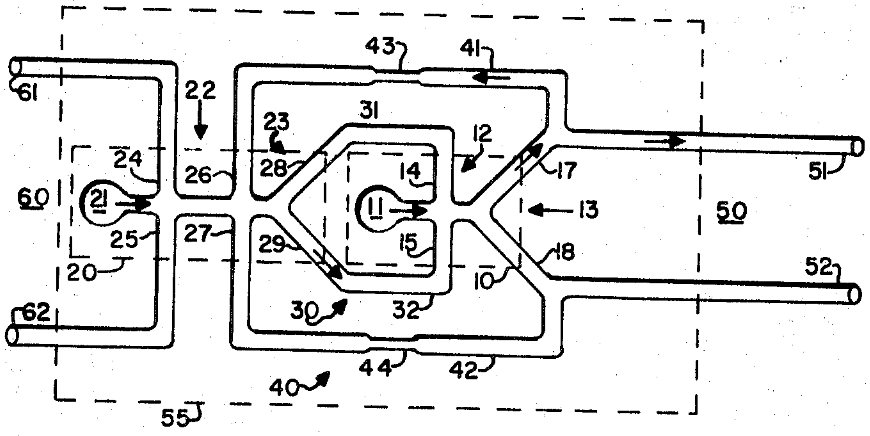
Figure 2:
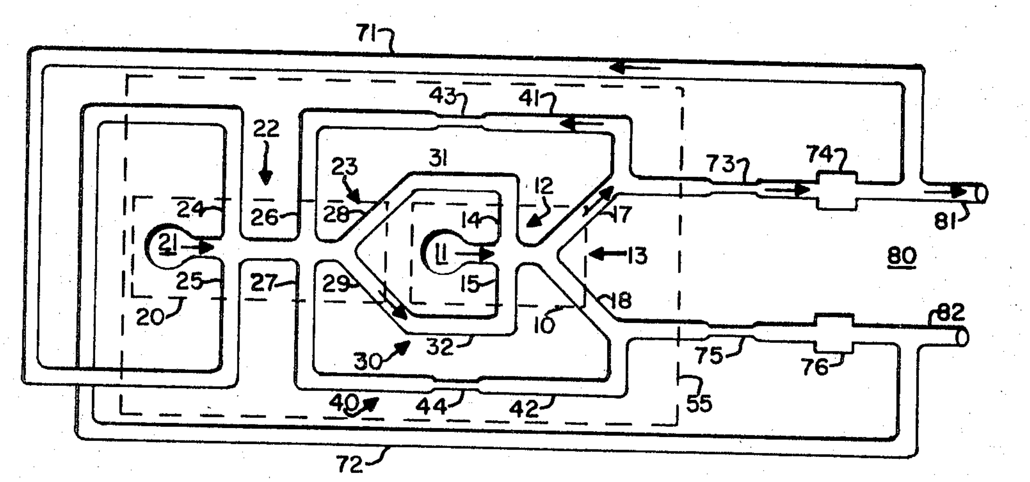

A complete understanding of the invention will become apparent from a study of the accompanying specification claims in conjunction with the drawing in which: FIGURE 1 is a schematic representation of the applicant's invention; and FIGURE 2 is a schematic representation of a fluid circuit utilizing the applicant's invention.

The applicant's invention has specific application to bistable pure fluid amplifier means and will be explained with reference thereto. However, the applicant's invention is not limited to bistable fluid amplifier means but may be utilized with other fluid apparatus, for example oscillators. Referring now to FIGURE 1, reference numeral 10 generally depicts a bistable pure fluid amplifier means. Bistable amplifier means 10 includes a fluid supply passage 11, control passage means 12 and outlet passages means 13. In this particular embodiment, control passage means 12 includes a pair of control passages 14 and 15 herein. It should be understood that bistable amplifier means 10 may utilize additional control passages. Outlet passage means 13 in this particular embodiment includes a pair of outlet passages 17 and 18. Additional outlet passages may be utilized.

Reference numeral 20 depicts a proportional pure fluid amplifier means. Proportional amplifier means 20 includes a fluid supply conduit 21, control conduit means 22, and outlet conduit means 23. In this particular embodiment, control conduit means 22 includes a first pair of control conduits 24, 25 and a second pair of control conduits 26, 27. Proportional amplifier means 20 may utilize only a pair of control conduits or a plurality of pairs of control conduits depending on the particular embodiment. Outlet conduit means 23 includes a pair of outlet conduits 28, 29 in this embodiment. Again, additional outlet conduits may be utilized in other embodiments.

Means 30 are provided for connecting outlet conduit means 23 of proportional amplifier means 20 to control passage means 12 of bistable amplifier means 10. Means 30 comprises a duct 31 connecting outlet conduit 28 to control passage 14 and a duct 32 connecting outlet conduit 29 to control passage 15. This proportional amplifier 20 is cascaded with bistable amplifier 10, of course, a plurality of amplifiers may be cascaded.

Reference numeral 40 depicts feedback circuit means connecting outlet passage means 13 of bistable amplifier means 10 to proportional amplifier means 20. In the particular embodiment illustrated in FIGURE 1, feedback circuit means 40 includes a first positive feedback loop 41 and a second positive feedback loop 42. Positive feedback loop 41 connects outlet passage 17 of bistable amplifier means 10 to control conduit 26 of proportional amplifier means 20. Positive feedback loop 42 connects outlet passage 18 of bistable amplifier means 10 to control conduit 27 of proportional amplifier means 20. Feedback loops 41 and 42 have fluid resistance means 43, 44 therein respectively to provide the proper pressure drop between outlet passage means 13 and control conduit means 22. Of course, the fluid resistances may be eliminated by properly sizing the feedback loops.

Bistable fluid amplifier means 10, proportional fluid amplifier means 20, means 30, and feedback circuit means 40, collectively define the applicant's unique bistable fluid apparatus. This fluid apparatus is identified by reference numeral 55.

Output signal means 50, energized from bistable amplifier means 10, are provided. In this particular embodiment output signal means 50 comprises an output passage 51 connected to outlet passage 17 and an output passage 52 connected to outlet passage 18. Of course, other output signal means may be utilized in the applicant's invention.

Input signal means 60 may be provided. In this particular embodiment input signal means 60 comprises an input duct 61 connected to control conduit 24 and an input duct 62 connected to control conduit 25. Other input signal means may be utilized for example, an input signal may be fed back from bistable fluid amplifier means 10. In this case fluid apparatus 55 may function as an oscillator, triangle wave generator or the like. As illustrated in FIGURE 1, fluid apparatus 55 functions as a bistable fluid amplifier.

In order to more clearly set forth the operation of the applicant's invention, a specific design thereof will be explained. Assume that it is desirable to have a bistable fluid amplifier means in a fluid control system that has the following characteristics: a fixed threshold switching level of 1.5 inches of mercury, a minimum variation in this switching threshold level, and a constant input impedance. It can be shown that in a typical prior art bistable fluid amplifier, such as 10, the instantaneous switching threshold level will vary from the design level by 30 percent or more. The basic phenomenon causing the variation in threshold switching level is not completely understood at this time and it has been impossible to design a bistable fluid amplifier having the above identified output characteristics. This fact has prevented the utilization of many pure fluid control systems because reasonable tolerance levels could not be maintained. In addition, the prior art bistable fluid amplifiers have varying input impedance which adversely affects fluid devices providing input signals thereto.

Bistable fluid amplifier means 10 has an initial switching level of 1.5 inches of mercury and a variation in the dynamic switching threshold level of .5 inch of mercury. Thus a pressure differential of 1.5 inches of mercury across control passages 14, 15 is theoretically required to switch the output of bistable amplifier means 10, but in operation it switches randomly at pressure differentials in the range between 1.0 and 2.0 inches of mercury. In addition, the control passages 14, 15 provide unequal impedances to any device providing an input signal thereto.

The applicant's invention substantially eliminates these problems by means of proportional amplifier means and feedback circuit means in combination with a prior art bistable fluid amplifier. The output signal of proportional amplifier means 20 is proportional to the input signal. Proportional amplifier means 20 has a pressure gain of 10 in this particular design, that is, the pressure differential across outlet conduit means 23 is ten times greater than the pressure differential across control conduit means 22. Bistable amplifier means 10 has a pressure gain of 3 in this particular embodiment and a pressure of 4.5 inches of mercury is present in either outlet passage 17 or outlet passage 18 when fluid flows therethrough. Fluid resistances 43 and 44 in feedback loops 41 and 42 are sized so as to feedback a pressure signal of 1.35 inches of mercury to control conduits 26, 27.

Supply passage 11 and supply conduit 21 are each connected to a suitable source of fluid and fluid flows therethrough. The fluid may be compressible or incompressible. Assume that fluid is initially flowing from supply passage 11 through outlet passage 17 of bistable fluid amplifier means 10. Arrows have been positioned in FIGURE 1 in order to indicate the direction of fluid flow in the apparatus in the initial condition only. The pressure level in outlet passage 17 is 4.5 inches of mercury; there is no fluid flow in outlet passage 18 and it is at zero pressure level. A portion of the fluid flowing through outlet passage 17 is conveyed through positive feedback loop 41 to control conduit 26 of proportional amplifier means 20. The pressure in control conduit 26 is 1.35 inches of mercury at this time. There is of course no flow in feedback loop 42 and the pressure level of control conduit 27 is zero. This pressure differential across control conduits 26, 27 is sufficient to divert all of the fluid flow from supply conduit 21 through outlet conduit 29, duct 32 and into control passage 15 of bistable amplifier means 10. There is no fluid flow in control passage 14 at this time. Consequently, fluid flow from proportional amplifier means 20 tends to maintain fluid flow in outlet passage 17 of fluid amplifier means 10.

In order to switch the output signal of bistable fluid amplifier means 10, an input signal must be provided in input signal means 60. If bistable fluid amplifier means 10 switches with a pressure differential of 1.5 inches of mercury across control passages 14, 15 then a pressure differential of .15 inch of mercury across control conduit means 22 is sufficient to cause bistable amplifier 10 to switch. This is because proportional amplifier means 20 has a pressure gain of 10. When a 1.5 inches of mercury input signal is provided in input duct 62, the fluid flow from supply conduit 21 is diverted so that the pressure in outlet conduit 28 exceeds the pressure in outlet conduit 29 by 1.5 inches of mercury. This results in the pressure in control passage 14 exceeding the pressure in control passage 15 by 1.5 inches of mercury and switches bistable fluid amplifier means 10 to outlet passage 18. A portion of the fluid flowing in outlet passage 18 is fed back to control conduit 27 through feedback loop 42 so as to provide a pressure of 1.35 inches of mercury. Bistable fluid amplifier means will remain in this condition until a signal of 1.5 inches of mercury is provided in input duct 61.

Let us assume that the instantaneous switching threshold level of bistable amplifier means 10 is 2.0 inches of mercury. Considering bistable fluid amplifier means 10 alone, it is clear that the switching threshold level has increased by 33 percent. Bistable amplifier means 10 will not switch until an input signal of 2.0 inches of mercury exists across control passages 14 and 15. Thus the output signal of bistable amplifier means 10 also will contain a 33 percent variation which cannot be tolerated in most fluid control systems.

The applicant's fluid apparatus 55 however, substantially eliminates this error due to a variation in the instantaneous switching threshold level. The change in switching threshold level of bistable amplifier means 10 from 1.5 to 2.0 inches of mercury be supplied to bistable amplifier 10. In the applicant's fluid apparatus, the change of .5 inch of mercury in bistable amplifier means 10 requires that a change in input signal of only .05 inch of mercury be supplied to proportional amplifier means 20, because amplifier means 20 has a pressure gain of 10. The change in switching level threshold from 1.5 to 2.0 inches of mercury has negligible affect on the pressure level existing in the outlet passages of bistable amplifier means 10. Accordingly, a pressure signal of 1.35 inches of mercury is fed back to proportional amplifier means 20.

Assume fluid is flowing through outlet passage 17 of bistable amplifier means 10 when the threshold switching level changes to 2.0 inches of mercury. Feedback loop 41 provides a pressure signal of 1.35 inches of mercury in control conduit 26. The pressure in control conduit 27 is zero. In order to switch bistable amplifier means 10 pressure differential of .2 inch of mercury must exist across control conduit means 22 so as to provide a pressure differential of 2.0 inches of mercury across control passage means 12. Thus the input signal in input duct 62 need only be increased to a level of 1.55 inches of mercury an increase of 0.5 inch of mercury. This is a variation of 3.3 percent; .05 divided by 1.55. Contrast this with bistable amplifier means alone wherein the variation was 33 percent; .5 divided by 1.5.

It should be pointed out, that the utilization of both proportional amplifier means and feedback circuit means is necessary to substantially reduce the variation in instantaneous threshold level. More specifically, a change in switching threshold level of .5 inch of mercury in bistable amplifier means 10 requires only a change of .05 inch of mercury in input signal to proportional amplifier means 20. However, utilization of proportional amplifier means 20 without feedback circuit means 40 merely reduces the magnitude of the variation of the threshold level, but does not reduce the percent variation therein. In our specific example, the .5 inch of mercury change in switching threshold level of bistable amplifier means 10 is reduced to a change of .05 inch of mercury by proportional fluid amplifier means 20. However, the input signal is also reduced from 1.5 to .15 inch of mercury which still leaves a variation of 33 percent. However, utilizing feedback circuit means 40 in combination with proportional fluid amplifier means 20 substantially reduces the percent variation in instantaneous threshold level. By feeding back a portion of the output signal to the proportional amplifier means, the necessary input signal to the proportional fluid amplifier means is increased. The overall affect in our particular example was a reduction from 33 percent variation to 3.3 percent variation. In addition, there is substantially no change in input impedance, in input ducts 61 and 62.

Thus the applicant"s invention meets the design characteristics of a switching threshold level of 1.5 p.s.i., a minimum percent variation in switching threshold of 3.3 percent, and substantially constant input impedance. The applicant does not wish to be limited to the above identified values which were utilized merely for purposes of illustration.

As indicated above, the fluid apparatus illustrated in FIGURE 1 functions as a bistable fluid amplifier means. The accuracy thereof was substantially improved by utilizing proportional fluid amplifier means and feedback circuit means in combination therewith. This fluid apparatus may be utilized in any fluid control system of fluid circuit. For example, the applicant's fluid apparatus may be utilized in an oscillator circuit as illustrated in FIGURE 2.

The circuit illustrated in FIGURE 2 is referred to as a triangle wave generator. In FIGURE 2, elements identical to those illustrated in FIGURE 1 are identified with the same reference numerals. Fluid apparatus 55 including fluid amplifier means 10, proportional fluid amplifier means 20, means 30 and feedback circuit means 40 is similar to that illustrated in FIGURE 1 and need not be described in detail. In this embodiment, the pressure gain of control conduits 24 and 25 is increased to 30; the pressure gain of control conduits 26 and 27 remains at 10. In all other respects amplifier 20 is identical to that illustrated in FIGURE 1 and like reference numerals are used. In addition, a negative feedback loop 71 is provided connecting outlet passage 17 of bistable amplifier means 10 to control conduit 25 of proportional amplifier means 20. Negative feedback loop 71 includes a fluid resistance 73 and a fluid capacitance 74 therein connected in a series relationship. Another negative feedback loop 72 is provided connecting outlet passage 18 of bistable amplifier means 10 to control conduit 24 of proportional amplifier means 20. Negative feedback loop 72 includes a fluid resistance 75 and a fluid capacitance 76 therein connected in series relationship.

Output signal means 80, energized from bistable amplifier means 10 are provided. In this particular embodiment, output signal means 80 comprises an output passage 81 connected to feedback loop 71 downstream from fluid resistance 73 and fluid capacitance 74 and an output passage 82 connected to feedback loop 72 downstream from fluid resistance 75 and fluid resistance 76. Other output signal means may be utilized.

In operation of the apparatus illustrated in FIGURE 2 functions as a triangle wave generator. Supply passage 11 and supply conduit 21 are each connected to a suitable high pressure fluid source and fluid flows therethrough. In the initial condition fluid from supply passage 11 is flowing through outlet passage 17 of bistable fluid amplifier means 10. Arrows have been positioned in FIGURE 2 to indicate the direction of fluid flow in the initial condition. In the particular design illustrated, the flow of fluid in outlet passage 17 creates a pressure of 4.5 inches of mercury therein. A portion of the fluid flowing through outlet passage 17 is conveyed through positive feedback loop 41 to control conduit 26 of proportional amplifier means 20. Resistor 43 in feedback loop 41 is proportioned so as to provide a pressure of 1.35 inches of mercury in control conduit 26. There is no fluid flow in outlet passage 18 at this time so that the pressure and the control conduit 27 is zero. The pressure differential of 1.35 inches of mercury across control conduits 26, 27 is sufficient to divert all of the fluid flow from supply conduit 21 through outlet conduit 29, duct 32 and into control passage 15 so as to maintain the fluid flow in outlet passage 17.

Another portion of the fluid flow through outlet passage 17 flows through negative feedback loop 71 to control conduit 25 of proportional amplifier means 20. Fluid resistance 73 and fluid capacitance 74 function to create a triangle wave input signal at control conduit 25 which has a nominal valve of 1.5 inches of mercury. In steady state operation the signal in feedback loop 71 oscillates .25 inch of mercury above and below the nominal valve in this particular design. There is initially no fluid flow in outlet passage 18 so that there is a zero pressure level in control conduit 24. Thus the initial pressure differential across control conduits 24, 25 is a signal tending to divert the fluid flow from the supply conduit 21 into outlet conduit 28, through duct 31 and into control passage 14. The pressure in control passage 14 tends to switch the fluid flow (if sufficient magnitude) from outlet passage 17 to outlet passage 18. Thus feedback loop 71 provides negative feedback signal.

If we assume a switching threshold level of 1.5 inches of mercury for bistable fluid amplifier means 10 and a gain of 10 for conduits 26 and 27 proportional amplifier means 20, bistable amplifier means 10 will switch when the pressure differential across control conduit means 22 is .15 inch of mercury. There will be no switching of the bistable fluid amplifier means 10 until the signal appearing in control conduit 25 becomes sufficiently large to overcome the effect of the signal appearing in control conduit 26. In addition, the signal in control conduit 25 must be larger than required to just overcome the effect of the signal in control conduit 26 by an amount sufficient to cause the signal produced in outlet passage 28 to exceed the signal produced in outlet passage 29 by 1.5 inches of mercury. Since the gain of control conduits 24, 25 is three times the gain of control conduits 26, 27, a signal in control conduit 25 which is .45 inch of mercury greater than the signal in control conduit 24 will overcome the effect of the 1.35 inches of mercury signal in control conduit 26. Since the gain of control conduits 24, 25 is 30, the signal in control conduit 25 must exceed the signal in control conduit 24 by an additional .05 inch of mercury to produce a signal in outlet passage 28 which exceeds the signal in outlet passage 29 by 1.5 inches of mercury. Thus, a signal in control conduit 25 which exceeds the signal in control conduit 24 by .45 plus .05 or .5 inch of mercury will switch bistable fluid amplifier means 10. At this time all of the fluid flow from supply passage 11 will be diverted out of outlet passage 18 and feedback loops 42 and 72 will function in a manner similar to feedback loops 41 and 71, and cause fluid amplifier means 10 to switch again. Thus the output of bistable fluid amplifier means 10 continually oscillates between outlet passage 17 and 18.

Output signal means 80 senses the output of the bistable fluid amplifier means 10. Since output passages 81 and 82 are connected downstream from the fluid resistance and fluid capacitance means in this particular embodiment a triangular wave having a particular frequency is sensed.

The variation in threshold switching level of a prior art bistable fluid amplifier would result in variations in the pulse duration and magnitude in a prior art triangle wave generator, and intrdouce errors in any system relying upon the intelligence of the pulse magnitude duration. However, the applicant substantially eliminates this error through the utilization of a proportional fluid amplifier means and a feedback circuit means in combination with a bistable amplifier and provides an output signal from the triangle wave generator having a substantially constant duration and magnitude.

What I claim is:

1. In combination with fluid apparatus including a proportional fluid amplifier having a supply conduit for providing fluid flow toward a plurality of outlet conduits positioned downstream therefrom and a plurality of control conduits positioned intermediate the supply conduits and the outlet conduits for providing fluid flow which impinges upon the fluid flow from the supply conduit and controls the fluid flow into the outlet conduits, bistable fluid apparatus having a supply passage for providing fluid flow toward a plurality of outlet passages positioned downstream therefrom and a plurality of control passages positioned intermediate the supply passage and the outlet passages for providing fluid flow which impinges upon the fluid flow from the supply passage and switches the fluid flow from one outlet passage to another, and means connecting the outlet conduits of said proportional fluid amplifier to the control passages of said bistable fluid apparatus means, the improvement which comprises feedback circuit means connecting the outlet passages of said bistable fluid apparatus means to the control conduits of said proportional fluid amplifier means so as to provide a positive feedback signal to said proportional fluid amplifier, said positive feedback signal having a magnitude less than that required to produce switching in said bistable fluid apparatus.

2. The apparatus of claim 1 in which said feedback circuit means includes a first positive feedback loop and a second positive feedback loop.

3. The apparatus of claim 2 in which said first feedback loop and said second feedback loop each include a fluid resistance therein.

4. Apparatus of the class described comprising:

(a) bistable fluid apparatus means including a fluid supply passage for issuing a fluid stream and outlet passage means for receiving said fluid stream, said bistable fluid apparatus means further including control passage means positioned intermediate said fluid supply passage and said outlet passage means for providing fluid signals operable to switch said fluid stream in said outlet passage means;

(b) proportional fluid amplifier means including a fluid supply conduit for issuing a fluid stream and outlet conduit means for receiving said fluid stream, said proportional fluid amplifier means further including control conduit means positioned intermediate said supply conduit and said outlet conduit means for providing fluid signals operable to control said fluid stream in said outlet conduit means;

(c) means connecting said outlet conduit means of said proportional amplifier means to said control passage means of said bistable fluid apparatus means;

(d) feedback circuit means connecting said outlet passage means of said bistable fluid apparatus means to said control conduit means of said proportional fluid amplifier means; and (e) output signal means communicating with said outlet passage means of said bistable fluid apparatus means.

5. The apparatus of claim 4 in which said control passage means includes a pair of opposed control passages, said outlet passage means includes a pair of outlet passages, said outlet conduit means includes a pair of outlet conduits, said control conduit means includes a first and second pair of opposed control conduits, said feedback circuit means includes a first positive feedback loop connecting one of said pair of outlet passages to one of said first pair of opposed control conduits and a second positive feedback loop connecting the other of said pair of outlet passages to the other of said first pair of opposed control conduits, whereby said feedback circuit means causes a signal to be produced in said outlet conduit means which is less than the switching threshold signal of said bistable fluid apparatus.

6. The apparatus of claim 5 in which said first feedback loop and said second feedback loop each include a fluid resistance.

7. The apparatus of claim 4 in which input signal means are connected to said proportional fluid amplifier means.

8. The apparatus of claim 5 in which input signal means are connected to said second pair of control conduits of said proportional amplifier means.

9. The apparatus of claim 5 in which a first negative feedback loop connects said one of said pair of outlet passages to one of said second pair of control conduits and a second negative feedback loop connects said other of said pair of outlet passages to the other of said second pair of control conduits.

10. The apparatus of claim 9 in which said first negative feedback loop includes a fluid resistance and a fluid capacitance connected in series relationship and said second negative feedback loop includes a fluid resistance and a fluid capacitance in series relationship.

References Cited

UNITED STATES PATENTS

| | | | |
|---|---|---|---|
| 3,155,825 | 11/1964 | Boothe | 137—81.5 |
| 3,223,101 | 12/1965 | Bowles | 137—81.5 |
| 3,240,220 | 3/1966 | Jones | 137—81.5 |
| 3,339,571 | 9/1967 | Hatch | 137—81.5 |

M. CARY NELSON, *Primary Examiner.*

W. R. CLINE, *Assistant Examiner.*

U.S. Cl. X.R.

235—201